(12) United States Patent
Terada et al.

(10) Patent No.: US 7,316,515 B2
(45) Date of Patent: Jan. 8, 2008

(54) LIQUID PROCESSING APPARATUS PROCESSING A SUBSTRATE SURFACE WITH A PROCESSING LIQUID, LIQUID PROCESSING METHOD, AND LIQUID CONDITION DETECTION APPARATUS DETECTING FLUCTUATION OF THE PROCESSING LIQUID

(75) Inventors: Shouichi Terada, Kumamoto (JP); Nobuyuki Sata, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 219 days.

(21) Appl. No.: 11/187,846

(22) Filed: Jul. 25, 2005

(65) Prior Publication Data
US 2006/0029388 A1    Feb. 9, 2006

(30) Foreign Application Priority Data
Aug. 5, 2004   (JP)   ............................. 2004-229568

(51) Int. Cl.
*G03D 5/00* (2006.01)
(52) U.S. Cl. .................. 396/611; 396/627; 355/27; 118/52; 430/5
(58) Field of Classification Search ................ 396/611
See application file for complete search history.

(56) References Cited

U.S. PATENT DOCUMENTS

| | | | |
|---|---|---|---|
| 3,712,203 A | * | 1/1973 | Kishi et al. ................. 396/570 |
| 4,671,309 A | * | 6/1987 | Iemura et al. ................ 399/57 |
| 4,943,735 A | * | 7/1990 | Nishikawa ................. 250/573 |
| 5,223,881 A | * | 6/1993 | Nakagawa et al. ......... 396/570 |
| 5,570,193 A | * | 10/1996 | Landa et al. ................ 356/442 |
| 6,811,962 B2 | * | 11/2004 | Yoshihara et al. .......... 430/325 |
| 2002/0164414 A1 | * | 11/2002 | Okubo et al. ................. 427/8 |

FOREIGN PATENT DOCUMENTS

| JP | 10-272407 | 10/1998 |
|---|---|---|
| JP | 2000-009655 | 1/2000 |

* cited by examiner

*Primary Examiner*—D. Rutledge
(74) *Attorney, Agent, or Firm*—Smith, Gambrell & Russell, LLP

(57) ABSTRACT

In a liquid processing apparatus a spin chuck holds a wafer having a surface supplied with a liquid to be applied through a nozzle receiving the liquid through a feed path and whether the liquid passing through the feed path has fluctuation is detected by a fluctuation detection device. Thus the liquid's condition in the feed path can be determined significantly accurately. Supplying the substrate with the liquid without fluctuation allows the substrate to receive the liquid in an optimal condition. A satisfactory liquid process can thus be performed.

16 Claims, 11 Drawing Sheets

US 7,316,515 B2

LIQUID PROCESSING APPARATUS PROCESSING A SUBSTRATE SURFACE WITH A PROCESSING LIQUID, LIQUID PROCESSING METHOD, AND LIQUID CONDITION DETECTION APPARATUS DETECTING FLUCTUATION OF THE PROCESSING LIQUID

BACKGROUND OF THE INVENTION

1. Field of the Invention

The present invention relates generally to liquid processing apparatuses, liquid processing methods, and liquid condition detection apparatuses, and particularly to liquid processing apparatuses and methods for example supplying photoresist or a similar prescribed processing liquid to a substrate's surface to process it as prescribed, and liquid condition detection apparatuses detecting whether the liquid has fluctuation.

2. Description of the Background Art

Conventionally a semiconductor fabrication process includes a photoresist step, at which photoresist serving as a prescribed processing liquid is applied on a surface of a substrate such as a semiconductor wafer (hereinafter simply referred to as a "wafer"), and then exposed to light and then developed with a developing agent to form a mask pattern on the surface. Generally, such a process is performed in a system having an application and development apparatus applying and developing photoresist, with an exposure apparatus connected to.

One technique employed to apply on the wafer's surface a liquid to be applied corresponding to a processing liquid, is spin coating. A liquid processing unit applied to this technique will now be simply described with reference to FIG. 14. Initially, a wafer W is held on a spin chuck 101 horizontally and a nozzle 110 jetting a liquid to be applied is set at a position opposite to a surface of wave W and jets the liquid fed via a path 111 from a source 112, such as a tank, supplying the liquid to supply the liquid on the wafer W surface at a center as wafer W is rotated around a vertical axis. The liquid is thus centrifugally spread across the wafer W surface to form a film of the liquid.

If a film of a liquid to be applied is formed on the wafer W surface to have a desired thickness, a set value in concentration of a component contained in the liquid to be applied that forms the film or the like serves as an important processing parameter. Conventionally, liquids having different levels of concentration corresponding to different thicknesses are prepared and a plurality of application systems are incorporated into an apparatus to allow each liquid having a different concentration to be independently supplied to wafer W, and in accordance with a target value in thickness as desired an appropriate system is selected to supply wafer W with a liquid of an optimum concentration. The existence of the plurality of application systems in the apparatus, however, complicates the apparatus's structure.

To address this disadvantage, for example as shown in FIG. 15, upstream of path 111 a branch is introduced and connected through paths respectively to a tank 113 storing a liquid concentrate of the liquid to be applied and a tank 114 storing a solvent corresponding to a concentration adjusting agent such as thinner. The liquid concentrate feeding path and the solvent feeding path meet at a mixture block 115a and downstream thereof a mixture means such as a line mixer 115 is arranged to change a ratio applied to mix the liquid concentrate and the solvent to prepare a liquid to be applied having an optimal concentration corresponding to a target value in thickness (see Japanese Patent Laying-Open No. 10-272407, for example). This approach is advantageous in that simply preparing a liquid concentrate and a solvent suffices to prepare liquids to be applied having different levels of concentration and the apparatus can dispense with the plurality of systems supplying liquids.

The above approach, however, has the following disadvantage: although it depends on how long path 111 is, a short but substantial period of time is required after a mixture ratio is changed and before a liquid present in a path extending from line mixer 115 to the nozzle 110 mouth is replaced and a liquid to be applied having an intended concentration is jet out the mouth. If a liquid which does not have the intended concentration should erroneously be applied on wafer W, a film of the liquid uneven in thickness in-plane results. This can contribute to an increased number of wasteful wafer W that cannot be used to manufacture products, and hence increased cost. As such, whether a liquid to be applied jetted out nozzle 110 has attained an intended concentration, i.e., whether an optimal liquid can be applied on wafer W, needs to be determined.

To detect a ratio between a liquid to be applied and a solvent mixed together by line mixer 115, a technique is employed, as follows: downstream of line mixer 115, path 111 is branched and a viscometer is arranged to measure a received liquid in viscosity and the mixture ratio is controlled so that the measured viscosity's value attains set values in viscosity corresponding to different target values in thickness (see Japanese Patent Laying-Open No. 2000-009655, for example). This approach is disadvantageous, however, in that if a viscometer in accordance with the JIS standard is used, its mechanism only allows a sampled liquid to be measured in a substantially still condition, and the viscometer cannot be incorporated in-line.

SUMMARY OF THE INVENTION

The present invention mainly contemplates a liquid processing apparatus and method that can supply a processing liquid in a condition optimal for a substrate.

The present invention also contemplates a liquid condition detection apparatus capable of detecting whether the processing liquid is steady in concentration as the liquid flows.

The present liquid processing apparatus supplies a prescribed processing liquid on a surface of a substrate to perform a prescribed process, and includes: a substrate holder holding the substrate; a nozzle supplying the processing liquid on the surface of the substrate held by the substrate holder; a feed path passing the processing liquid to the nozzle; and a fluctuation detection device detecting whether the processing liquid flowing through the feed path has fluctuation.

Preferably the fluctuation detection device includes: an optically transparent member having a flow path passing therethrough to pass the processing liquid; a mark provided on a side surface of the optically transparent member to be picked up; an image acquirer facing the mark with the flow path posed therebetween for obtaining image data of the mark with the processing liquid posed between the image acquirer and the mark; and an image processor detecting from obtained image data of the mark whether the processing liquid has fluctuation. Note that "image data of a mark" as referred to herein is not limited to an exact picked up image of the mark and also includes the mark's shadow as well as the mark and its shadow reflected by a screen plate, a mirror or the like. As such, substantially being opposite via the screen plate, the mirror or the like is sufficient to obtain the present invention's effect, and such is also included in "facing the mark with the flow path posed therebetween".

Furthermore, preferably, the image processor detects whether the processing liquid has fluctuation from information obtained by comparing first image data of the mark and second image data of the mark obtained later than the first image data. In that case, the optically transparent member may be a polygonal, cylindrical transparent member having the flow path passing therethrough. Furthermore, the optically transparent member's one side surface provided with the mark and other side surface opposite the image acquirer may be provided at mutually parallel planar portions, respectively. Furthermore, the feed path may be connected to a feed path feeding a concentration adjusting liquid adjusting the processing liquid in concentration, and the feed path feeding the processing liquid may be provided with a liquid mixer for mixing the concentration adjusting liquid into a liquid to be applied. Furthermore, the apparatus may further include a controller controlling the apparatus to supply the substrate with the processing liquid free of fluctuation.

The present invention provides a method supplying a prescribed processing liquid on a surface of a substrate held by a substrate holder to perform a prescribed process, including the steps of: jetting out the processing liquid through a nozzle; and detecting whether the processing liquid flowing through a feed path feeding the processing liquid to the nozzle, has fluctuation.

Preferably, in the step of detecting, the feed path passes the processing liquid, while image data of a mark behind the processing liquid is obtained and used to detect whether the processing liquid has fluctuation. Furthermore, preferably, in the step of detecting, first image data of the mark and second image data of the mark obtained later than the first image data are compared to obtain information used to detect whether the processing liquid has fluctuation. Furthermore, the processing liquid jetted out through the nozzle may be a liquid having been mixed with a concentration adjusting liquid upstream of the feed path. Furthermore, the method may also include the step of exerting control to supply the processing liquid to the substrate free of fluctuation.

The present invention provides a liquid condition detection apparatus including: an optically transparent member having a flow path passing therethrough to pass the processing liquid; a mark provided on a side surface of the optically transparent member to be picked up; an image acquirer facing the mark with the flow path posed therebetween for obtaining image data of the mark with the processing liquid posed between the image acquirer and the mark; and a fluctuation detector detecting from obtained image data of the mark whether the processing liquid has fluctuation.

Preferably the fluctuation detector detects whether the processing liquid has fluctuation from information obtained by comparing first image data of the mark and second image data of the mark obtained later than the first image data. Furthermore, preferably, the optically transparent member is a polygonal, cylindrical transparent member. Furthermore, the optically transparent member's one side surface provided with the mark and other side surface opposite the image acquirer may be provided at mutually parallel planar portions, respectively.

In accordance with the present invention whether a liquid passed through a feed path to a nozzle has fluctuation can be detected to accurately determine for example how the liquid present in the feed path is replaced, mixed or the like. If a liquid without fluctuation can be supplied to a substrate, as a result the substrate can be supplied with an optimal liquid to be applied, and accordingly undergo a satisfactory liquid application process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
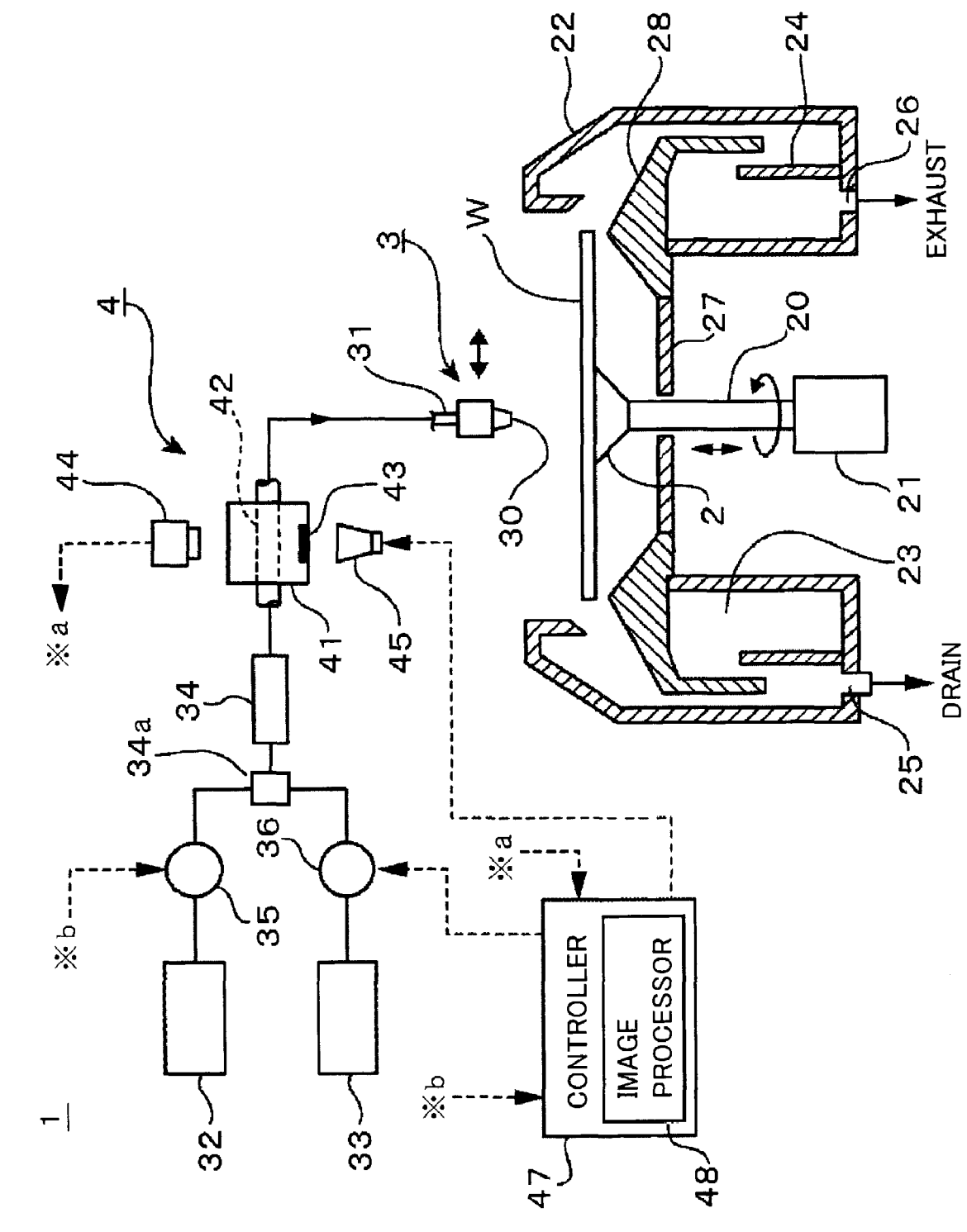
FIG. 1 is a vertical cross section of the present liquid processing apparatus in an embodiment.
Figure 2:
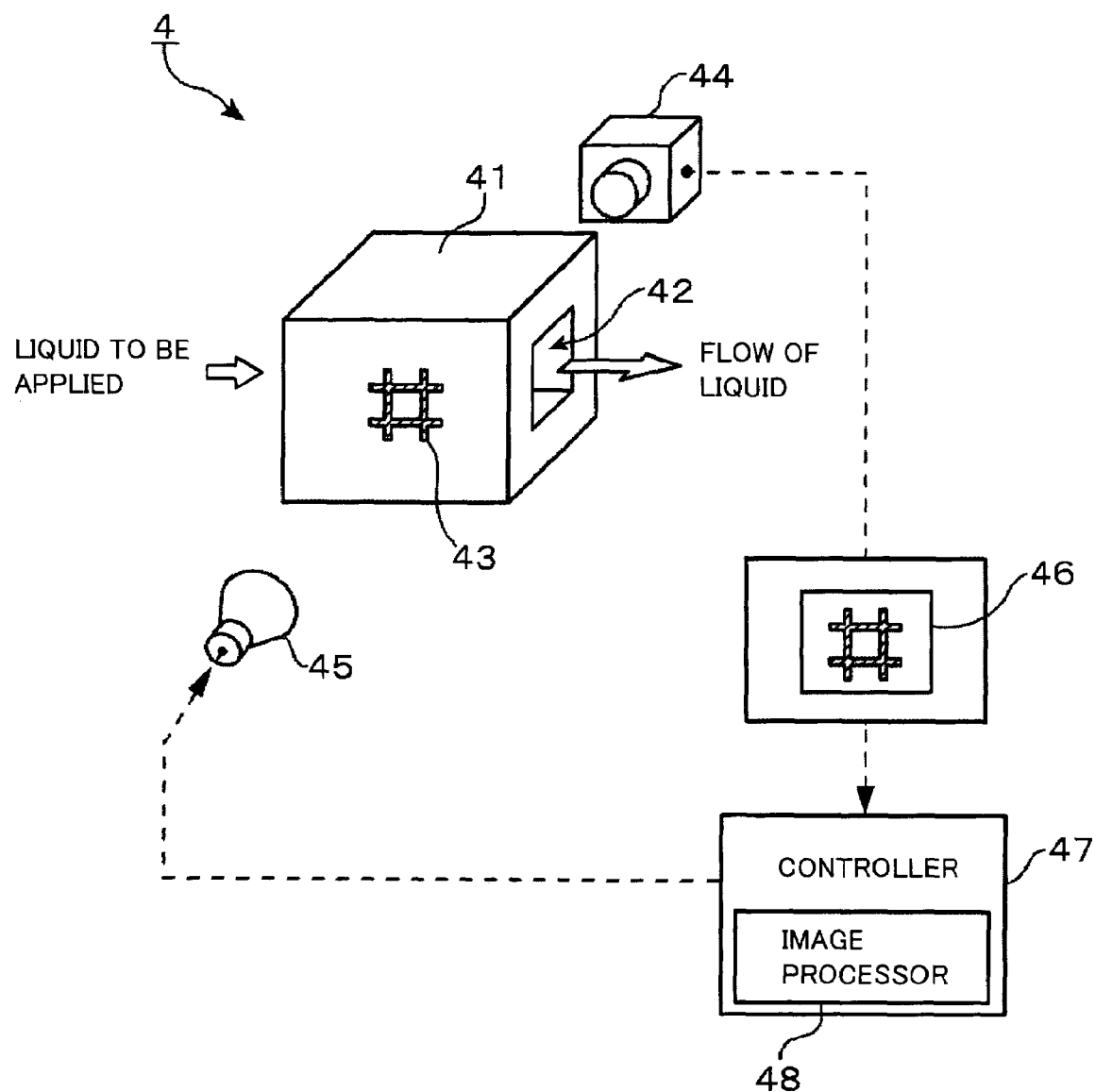
FIG. 2 is a diagram for illustrating the apparatus's fluctuation detection device.

The present liquid processing apparatus is applied in an embodiment to an application apparatus 1 supplying to a substrate a liquid to be applied corresponding to a processing liquid, as will be described hereinafter with reference to FIGS. 1 and 2. In FIG. 1, a spin chuck 2 provides a substrate holder attracting a center portion of a rear surface of wafer W and horizontally holding the wafer. Spin chuck 2 is connected by an axle 20 to a drive mechanism 21 allowing spin chuck 2 to be vertically movable and rotatable while holding wafer W. Furthermore, wafer W held by spin chuck 2 is surrounded by a cup 22 having an upper portion opened to surround wafer W. Cup 22 has a side circumferential surface with an upper portion inclined inward and furthermore having an end bent downward. Furthermore, cup 22 has a bottom providing a liquid receiver 23 in the form of a recess circumferentially. Liquid receiver 23 has its internal region radially sectioned by a diaphragm 24 to provide radially outer and inner regions. The outer region has a bottom with a drain port 25 draining out a received liquid to be applied or similar drain, and the inner region has an exhaust port 26.

Furthermore, wafer W overlies a disk 27 surrounded by a ring member 28 having an outer end surface bent downward so that the liquid spilled from wafer W flows on a surface of ring member 28 and is thus guided into the liquid receiver 23 outer region. Although not shown, for example three substrate supporting pins capable of ascending and descending while supporting wafer W at the rear surface can penetrate disk 27 vertically and thus protrude and recede as desired, and corporate with a wafer carrying arm entering from outside the main body of the apparatus to pass wafer W to spin chuck 2.

Furthermore, a nozzle 3 applying a processing liquid is provided to be capable of move vertically and proceed and recede as desired. Nozzle 3 has a mouth 30 in the form of a small hole facing a center of a front surface of wafer held by spin chuck 2 such that the wafer and the mouth are spaced. Nozzle 3 is connected to one end of a feed path 31 such as a piping, and the other end of feed path 31 is branched in two and the two branches are connected respectively to a source 32 supplying the liquid to be applied and a source 33 supplying a concentration adjusting agent, such as thinner or a similar solvent, to adjust the concentration of the liquid to be applied. Furthermore, a mixture means, such as a line mixture 34, for mixing the liquid to be applied and the concentration adjusting agent is provided on feed path 31 extending from a mixture block 34a, at which the liquid to the applied and the concentration adjusting agent meet, to nozzle 3. Furthermore, of feed path 31, the two branches are each provided with a liquid transport means, respectively, such a bellows pump 35, 36, capable of modify a jet stroke to adjust a flow rate, as desired. Note that at a location outer than wafer W held by spin chuck 2 there is a position at which nozzle 3 stands by, and at this nozzle standby position there is provided an effluent receiver (not shown) receiving an effluent for example when mouth 30 drains the liquid to be applied and thus replaces the liquid present in feed path 31. Although not shown, line mixer 34 is provided for example in the form of a cylinder longitudinally provided with a plurality of baffle boards. These baffle boards are for example plates having a width substantially equal to the cylinder's inner diameter and twisted in longitudinal direction by 90° rightward or leftward. It should be noted, however, that in the present invention the mixture means is not limited to line mixer 34 and any mixture means that is capable of mixing the liquid may be employed. Furthermore, line mixer 34 and mixture block 34a may integrally be configured, rather than separately provided.

Downstream of line mixer 34 a fluctuation detection device 4 is arranged to optically detect whether the liquid to be applied fed through feed path 31 to nozzle 3 has fluctuation to determine the condition of the liquid present in path 31, e.g., how the liquid in path 31 is replaced, how the liquid and a solvent are mixed together, and the like. Fluctuation detection device 4 will now be more specifically described with reference to FIG. 2. In the figure, a transparent member 41 is a polygonal cylindrical member formed of optically transparent material such as quartz, glass, or the like and provided on feed path 31. Transparent member 41 opens at opposite ends, which are connected to feed path 31, and has a rectangular internal surface defining a liquid flow path 42 passing the liquid to be applied. In this example, transparent member 41 in set for example to have a length of 20 mm, a width of 15 mm and a height of 15 mm and liquid flow path 42 is set for example to have a length 20 mm, a width of 5 mm and a height of 5 mm with a flow rate for example of 0.02 to 0.1 mm/s. Transparent member 41 as seen lengthwise has one side surface having a center bearing a mark 43 that can be a subject to be imaged by an image acquisition means, as will be described later. Mark 43 is for example a block or similarly colored "#" mark.

Transparent member 41 as seen lengthwise also has a side surface opposite the mark 43 bearing side surface with liquid flow path 42 therebetween and facing an image acquisition means such as a CCD camera 44 with a distance therebetween. Furthermore, the side surface bearing mark 43 faces an illumination means with a gap therebetween. The illumination means is for example a light 45 capable of illuminating the mark bearing side surface with light of a single color having a prescribed wavelength. More specifically, CCD camera 44 can pick up mark 43 with a liquid to be applied flowing therebetween through liquid flow path 42 and an image 46 of the picked up mark 43 is transmitted by wire or wireless to a controller 47 and therein an image processor 48 processes the image, as prescribed. Note that while in this example mark 43 is a "#" mark, mark 43 is not limited thereto and may for example be a circle, a square, or the like. Furthermore, light 45 may emit any type of light. Preferably, however, it emits light of a single color having a wavelength that does not alter a component of the liquid to be applied. Furthermore, an optical filter may be arranged between CCD camera 44 and transparent member 41. Furthermore, an optical filter may also be arranged between light 45 and transparent member 41, and in that case, mark 43 may be provided to the optical filter.

Figure 3:
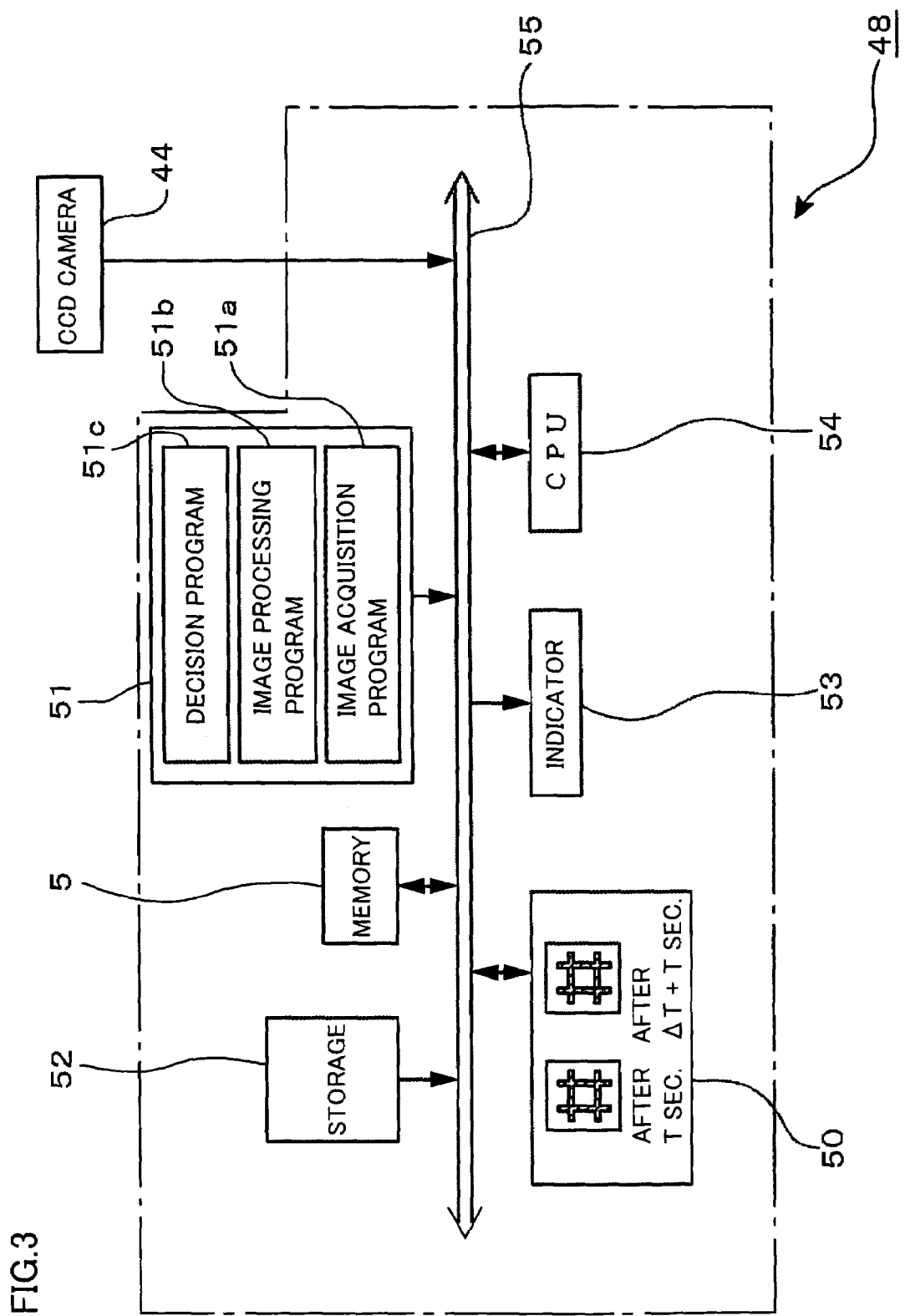
FIG. 3 is a diagram for illustrating the apparatus's image processor.

Image processor 48 will now be more specifically described with reference to FIG. 3. Note that while FIG. 3 schematically shows image processor 48 on a function by function basis for the sake of illustration, in effect, image processor 48 is implemented by a computer system including a CPU. In FIG. 3, a memory 5 temporarily stores image data of mark 43 obtained by CCD camera 44. An image data storage 50 stores image data of mark 43 sampled as timed as predetermined. A storage 51 stores a processing program including an image acquisition program 51a obtaining image data of mark 43, an image processing program 51b binarizing the obtained image data to obtain liquid condition information, and a decision program 51c employing the obtained liquid condition information to determine whether the liquid to be applied has fluctuation. Furthermore, a storage 52 stores a set value of a threshold value read in binarizing the image data, as will be described later more specifically. An indicator 53 is for example a display allowing an operator to visually confirm a result of the decision. These components and a CPU 54 are connected to a bus 55. Image processor 48 includes a fluctuation detector detecting the liquid's fluctuation from the image data of mark 43.

Figure 4:
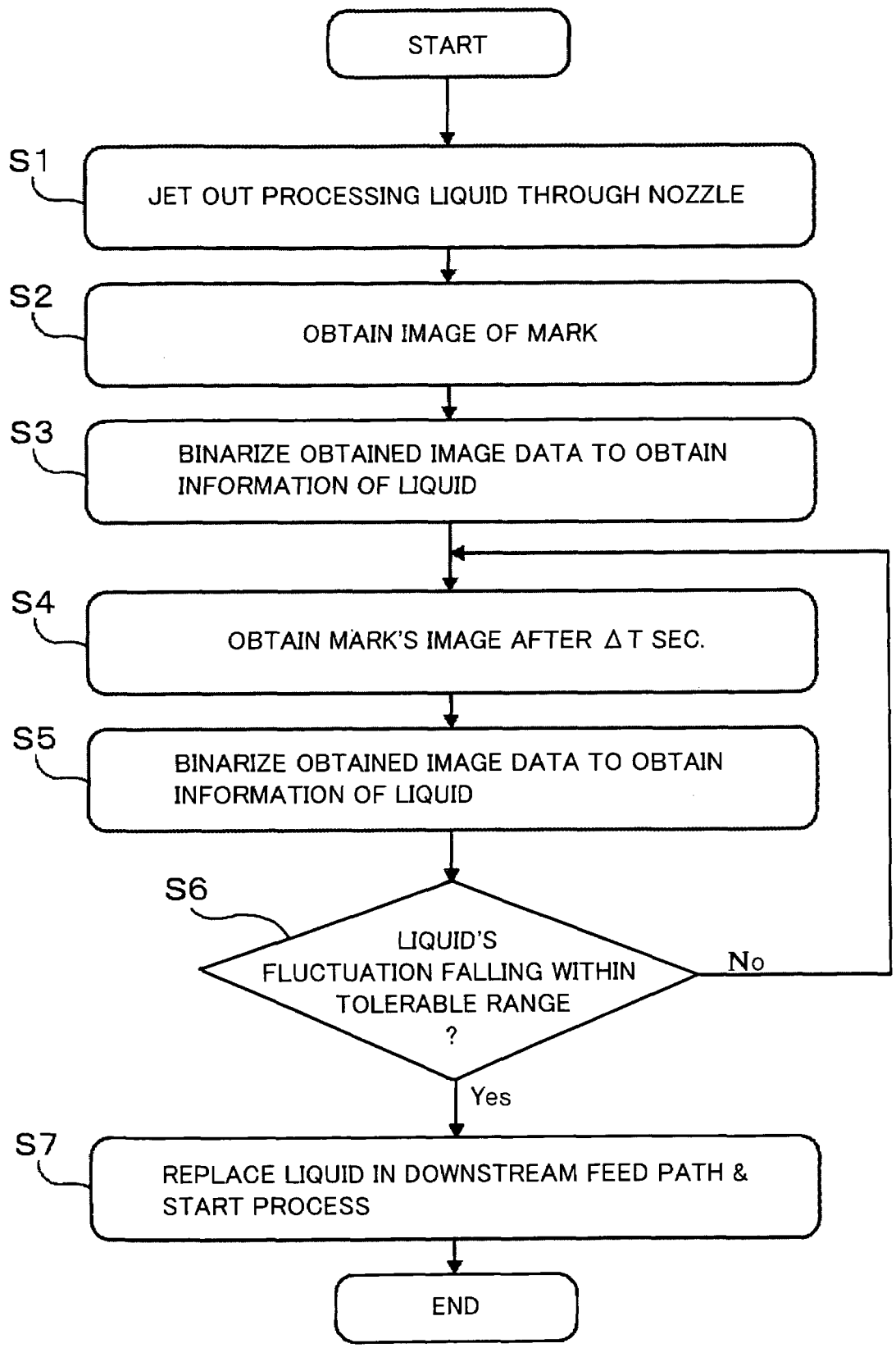
FIG. 4 is a flow chart of a procedure employing the apparatus to process a substrate.

The above described liquid processing apparatus is used for example to process a substrate, such as wafer W, with a liquid, as will be described hereinafter. Initially, for example after a lot's wafer W is processed and before a subsequent lot's wafer W is processed the currently set mixture ratio of the liquid to be applied and the solvent is changed to obtain an optimal concentration corresponding to a target value in thickness of the subsequent lot's wafer W, and whether mouth 30 jets out the liquid with a steady, intended concentration is inspected through a procedure, as will be described hereinafter with reference to FIG. 4. Initially, nozzle 3 recedes to the nozzle standby position and for example the bellows pump 35, 36 jet stroke's set value is changed to change the current mixture ratio of the liquid to be applied and the solvent, and nozzle 3 also starts to jet out (or discharge) the liquid through mouth 3 to replace the liquid present in feed path 31 (step S1).

Subsequently as timed as prescribed, e.g., after the nozzle 3 mouth 30 starts jetting out the liquid when a prescribed temporal period for example of one second elapses, or at a time point T1, image acquisition program 51a is read, light 45 turned on, and CCD camera 44 picks up mark 43 with the liquid flowing therebetween through liquid flow path 42 to obtain first image data of mark 43 corresponding to time point T1 (step S2). The obtained image data of mark 43 is converted by a converter (not shown) to digital information and transmitted to image processor 48, and thus stored in image data storage 50 as the image data of mark 43 corresponding to time point T1. Furthermore, in image processor 48, image processing program 51b is read and the image data is binarized, and a result thereof is stored to image data storage 50 as liquid condition information corresponding to time T1 (step S3).

Note that the mark is not necessarily be picked up with the liquid flowing. For example, jetting out the liquid to be applied may temporarily be interrupted to render still the liquid present in liquid flow path 42, while the mark may be picked up.

Figure 5A:
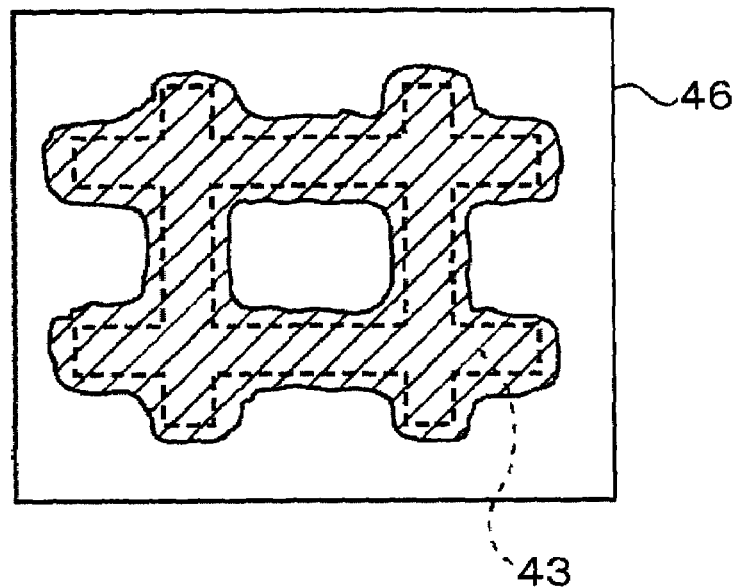
FIGS. 5A-5B schematically illustrate a process performed at the image processor.
Figure 5B:
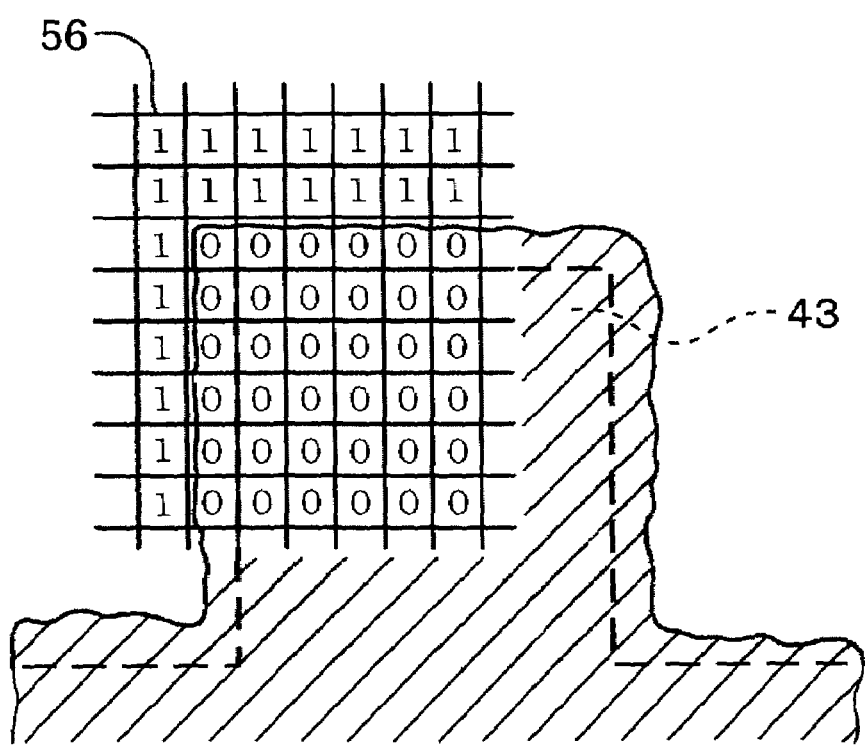

Image processor 48 binarizes image data, as described hereinafter with reference to FIGS. 5A and 5B. More specifically, CCD camera 44 obtains image data, which is represented in subregions 56 corresponding for example to pixels of CCD camera 44, and from information on brightness, an element forming an image, each subregion is assigned for example a logic of "0" for a level of brightness between predetermined upper and lower threshold values or a logic of "1" for a level of brightness outside the range between the upper and lower threshold values to assign all subregions binary information of "0" or "1" to process an image. More specifically, by way of example, if at time point T1 the liquid to be applied and the solvent are insufficiently mixed together then the liquid present in liquid flow path 42 has a distribution in density and its index of refraction varies resulting in fluctuation. As such, when CCD camera 44 picks up mark 43 and thus obtains its image data 46, mark 43, behind the fluctuating liquid, blurs, for example as shown in FIG. 5A. As such, if a threshold value is set so that a portion corresponding to mark 43 is assign the logic "0" and a region outer than an edge of mark 43 is assigned the logic "1", and image data 46 is binarized, then, as shown in FIG. 5B, a portion corresponding to subregion 56 outer than the edge of mark 43 that should be assigned the logic "1" is assigned the logic "0", and for example by taking a difference from image data of mark 43 obtained when the liquid does not have fluctuation, a portion assigned the logic "1" by fluctuation is detected (or extracted). In other words, whether the liquid to be applied has fluctuation or not can thus be detected.

Furthermore, after time point T1 when a prescribed temporal period (ΔT) for example of 0.3 second elapses, or at a time point T2 (i.e., T1+ΔT), image acquisition program 51a is read, light 45 turned on, and CCD camera 44 picks up mark 43 with the liquid flowing therebetween through liquid flow path 42 to obtain second image data of mark 43 corresponding to time point T2 (step S4). The obtained image data of mark 43 is converted by the converter (not shown) to digital information and transmitted to image processor 48, and thus stored in image data storage 50 as the image data of mark 43 corresponding to time point T2. Furthermore, in image processor 48, image processing program 51b is read and the image data is binarized, and a result thereof is stored to image data storage 50 as liquid condition information corresponding to time T2 (step S5).

Subsequently, decision program 51c is read and employed to obtain differential information corresponding to the liquid condition information obtained at step S5 and corresponding to time point T2 minus that obtained at step S3 and corresponding to time point TI and employs the differential information to determine whether the liquid has fluctuation (step S6). More specifically, whether the differential information obtained by subtracting the liquid information at time point T1 from that at time point T2 includes a subregion assigned the logic "1", is determined. If there is not a subregion assigned the logic "1" then a decision is made that the liquid does not have fluctuation. If there is such subregion then a decision is made that the liquid has fluctuation. It should be noted, however, that if the number of subregions assigned the logic "1" is smaller than a predetermined tolerable range, a decision may be made that the liquid does not have fluctuation.

Figure 6:
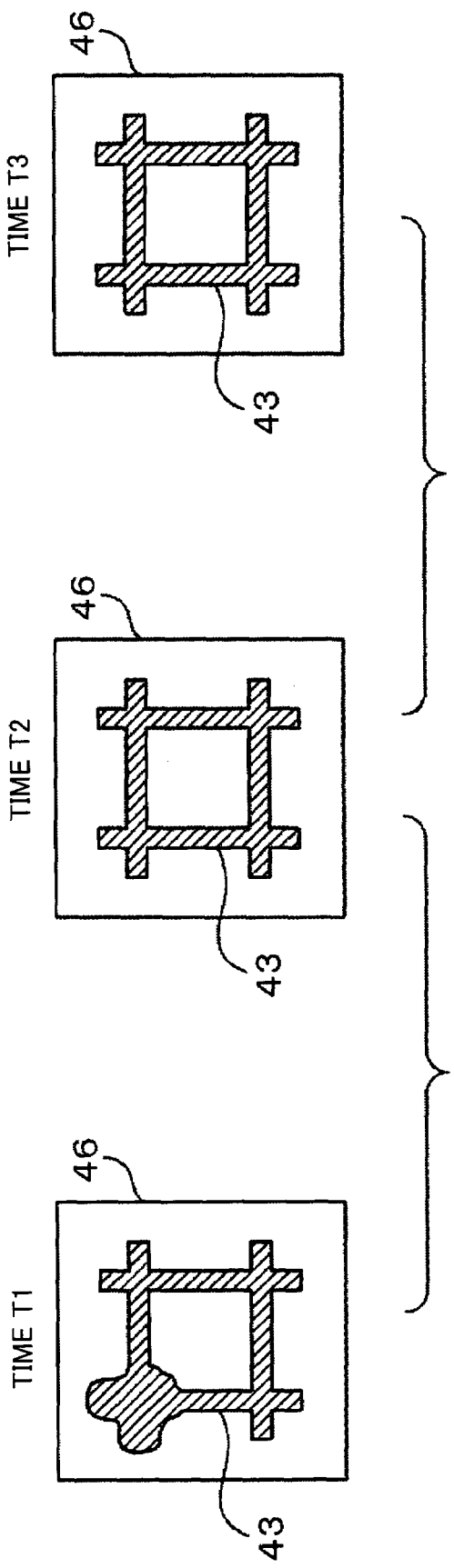
FIG. 6 illustrates how differential information of two images' data is obtained.

If at step S6 a decision is made that the liquid does not have fluctuation, then, for example, as required, the liquid to be applied is drained for a prescribed period of time to replace the liquid present in the feed path 31 downstream of fluctuation detection device 4 and jetting the liquid to be applied is thereafter stopped, and a process is subsequently started as controlled by controller 47 (S7). In contrast, if at step S6. a decision is made that the liquid has fluctuation, then, a prescribed, further period of time is allowed to elapse, and when a time point T3 (i.e., T2+ΔT) is reached, image data of mark 43 is obtained, and the image data corresponding to time point T2 and that corresponding to time point T3 are used as first and second image data, respectively, to obtain differential information to determine whether the liquid has fluctuation (steps S4-S6). More specifically, with reference to FIG. 6, if at time point T1 the liquid has fluctuation and at time point T2 it does not, and the difference between the image data at time point T2 and that at time point T1 is taken, a portion assigned the logic "1" is extracted although it should be assigned the logic "0". Thus a decision is made that the liquid has fluctuation. The difference between the subsequently obtained image data corresponding to time points T3 and T2 is taken, and there is not a portion extracted assigned the logic "1". A decision is made that the liquid does not have fluctuation.

The above process will now be more specifically described. Initially, a carrying arm (not shown) carries wafer W into the apparatus and cooperates with a substrate supporting pin to pass wafer W to spin chuck 2. Wafer W has a rear surface attracted and thus held on spin chuck 2 horizontally, while the arm, having passed wafer W, recedes external to the apparatus. Subsequently nozzle 3 is set at a position opposite a center of a front surface of wafer W and jets out a liquid through mouth 30 to supply and thus apply the liquid on wafer W, while drive mechanism 21 rotates wafer W at a prescribed rate of rotation to turn wafer W around a vertical axis to centrifugally spread the liquid toward the wafer's periphery and furthermore, spin excessive liquid out wafer W so that the wafer's front surface has the liquid applied in the form of a thin film. Thereafter, the arm enters the apparatus and receives wafer W from spin chuck 2 and carries it external to the apparatus to complete the liquid application process. If wafer W is repeatedly processed, the same procedure is employed.

Figure 7:
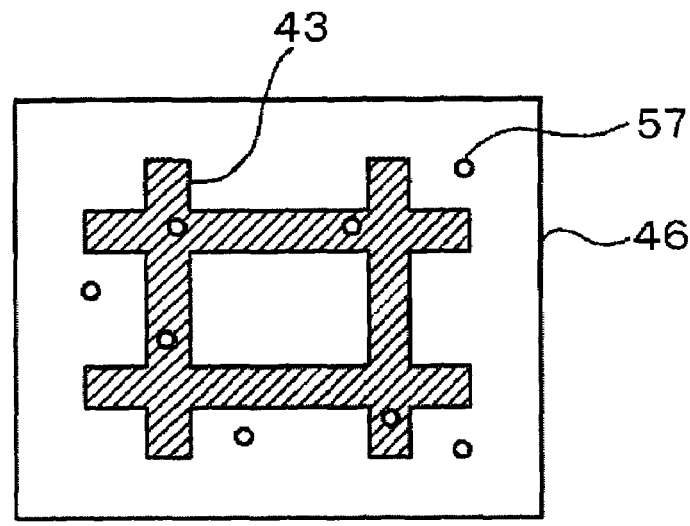
FIG. 7 illustrates data of an image of a mark behind a liquid applied containing a foreign matter.

Note that when the above process is performed steps S2-S7 are also performed, and for example if bellows pump 35, 36 has abnormality resulting in a changed mixture ratio or a similar unexpected accident arises, and resultant fluctuation is detected in the liquid, then alarm means (not shown) may give an alarm to alarm an operator, and if the liquid has too large fluctuation then an interlock that stops the apparatus may be actuated by controller 47. Note that if the liquid to be applied contains particles or similar foreign matter 57 or bubbles introduced therein, for example as shown in FIG. 7, the liquid varies in optical transmittance and appears to have fluctuation, and by binarizing image data of mark 43, whether such foreign matter, bubbles and the like are present or absent can be determined.

More specifically, as referred to in the present invention, "a liquid has fluctuation" means that when a liquid to be applied present in feed path 31 is replaced the liquid is mixed with a liquid to be applied having a different level of concentration and as a result the liquid has fluctuation, that a liquid to be applied and a solvent are insufficiently mixed together and as a result the liquid has fluctuation, and/or that a liquid contains a foreign matter, bubbles and/or the like and as a result has fluctuation.

In the above embodiment, whether a liquid supplied through nozzle 3 to be applied on a surface of wafer W has fluctuation can be detected to determine from the presence/absence of the fluctuation how the liquid present in feed path 31 is replaced and mixed and whether a foreign matter, bubbles and/or the like are present or absent. If a liquid without fluctuation can be supplied to wafer W, as a result wafer W can be supplied with an optimal liquid to be applied, and accordingly undergo a satisfactory liquid application process. This can prevent wafer W from erroneously receiving a liquid that does not have a prescribed level of concentration and thus contribute to an extremely reduced number of wafers Ws otherwise wasted. More specifically, the present inventors have noted that if a liquid present in feed path 31 is insufficiently replaced or a liquid to be applied is insufficiently mixed with a solvent the liquid has fluctuation, and have determined whether the liquid has fluctuation or not from image data for example of mark 43 present behind the liquid to determine with high accuracy the liquid's condition present in feed path 31. Note that an organic liquid employed to provide photoresist, insulation film and the like, and thinner provide a large difference in density, which particularly promotes fluctuation. As such, if the present invention is applied to such organic liquid and thinner mixed together to provide a liquid to be applied, how they are mixed together can more reliably be determined.

Furthermore, in the above embodiment, differential information between image data corresponding to time points T1 and T2 can be obtained to extract only fluctuation of a liquid to make a decision. Whether the liquid has fluctuation or not can be detected with high precision, and the necessity can also be eliminated of considering whether transparent member 41 has a soiled surface, how the member is exposed to light emitted from light 45, and the like. In other words, noises attributed to such factors can be cancelled to ensure reliable detection.

Figure 8:
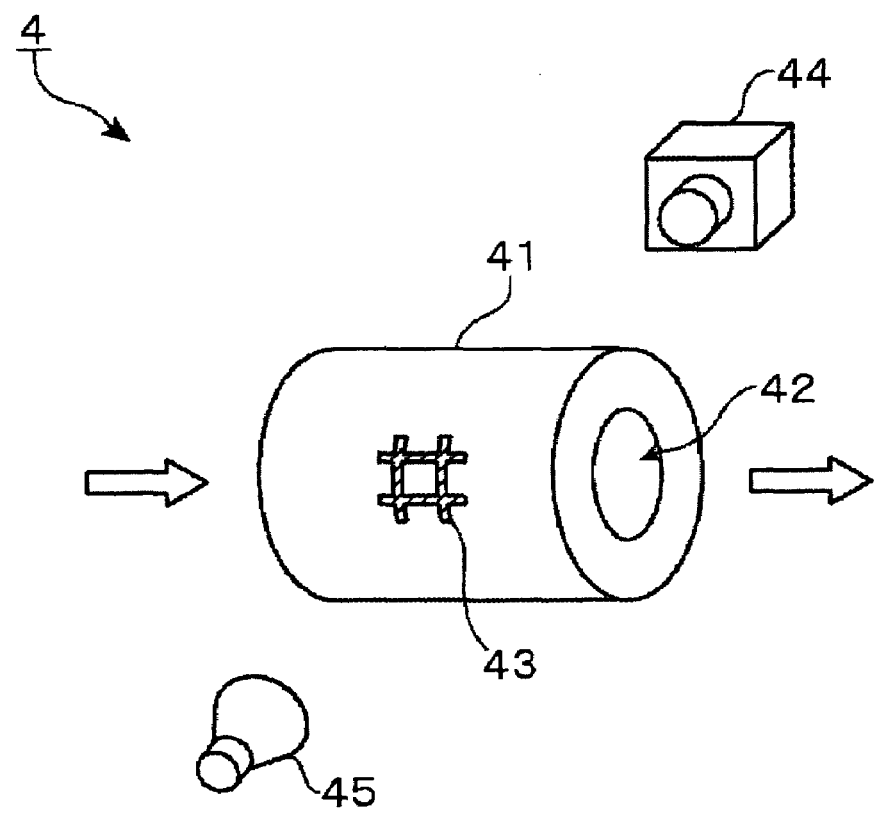
FIG. 8 illustrates the fluctuation detection device in another example.

Furthermore, in the above embodiment, transparent member 41 is not limited to a polygonal cylinder, and may be in the form of a circular cylinder, for example as shown in FIG. 8, or an ellipse, although desirably, transparent member 41 is provided in the form of a polygonal cylinder, since transparent member 41 in the form of a polygonal cylinder can minimize refraction of light passing therethrough and thus further ensure that a highly precise image of mark 43 can be picked up. In other words, the present invention is advantageous in that a structure free of a curved surface can prevent a lens effect otherwise introduced resulting in impaired image precision. Furthermore, transparent member 41 in the form of a polygonal cylinder is not required to have its entirety formed of transparent material: it is only required to at least have a portion bearing mark 43 and that facing CCD camera 44 formed of optically transparent material. Furthermore, it is only required to at least have the portions in parallel. Such arrangement can also provide an effect similar to that as described above.

Furthermore in the present invention the image acquisition means is not limited to CCD camera 44 and may for example be a line sensor. Such arrangement can also provide an effect similar to that as described above.

Furthermore in the present invention two images' data are obtained and their differential information is used to determine whether a liquid has fluctuation. Alternatively, a single mark 43's image data may be binarized and a result thereof alone may be used to determine whether a liquid has fluctuation. Such arrangement can also provide an effect similar to that described above.

Furthermore, in the present invention, as described above, subsequently obtained image data provides a difference from the immediately preceding, obtained image data. Alternatively, for example, initially obtained image data may be set as an initial image and subsequently obtained image data may provide a difference from the initial image. In that case, time point T1 referred to in the above example may be before starting to jet out a liquid to be applied. Such an arrangement can also provide an effect similar to that as described above. Furthermore, for example, liquids to be applied prepared to have different levels of concentration are interposed and image data that can serve as a sample may be previously obtained, and whether obtained image data is the same as the sample image data may be determined.

Figure 9:
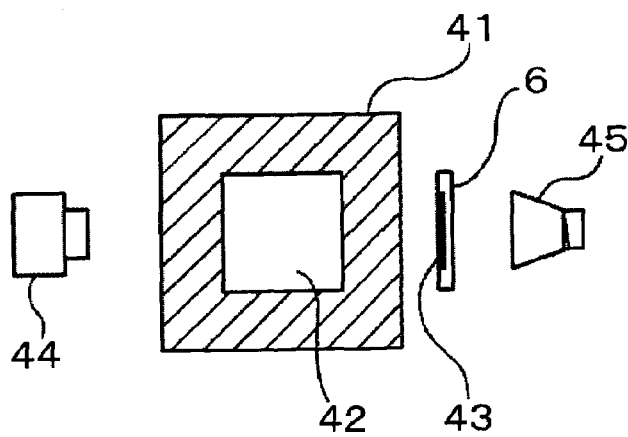
FIGS. 9-11 illustrate the fluctuation detection devices in still another examples, respectively.

In the present invention, as described above, mark 43 is arranged on a side surface of transparent member 41. Alternatively, as shown for example in FIG. 9, mark 43 is arranged on a transparent plate 6 posed between transparent member 41 and light 45. Such an arrangement can also provide an effect similar to that as described above.

Figure 10:
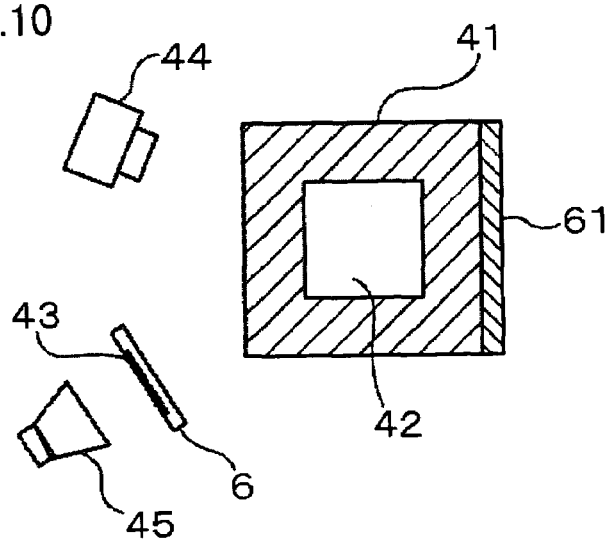
Figure 11:
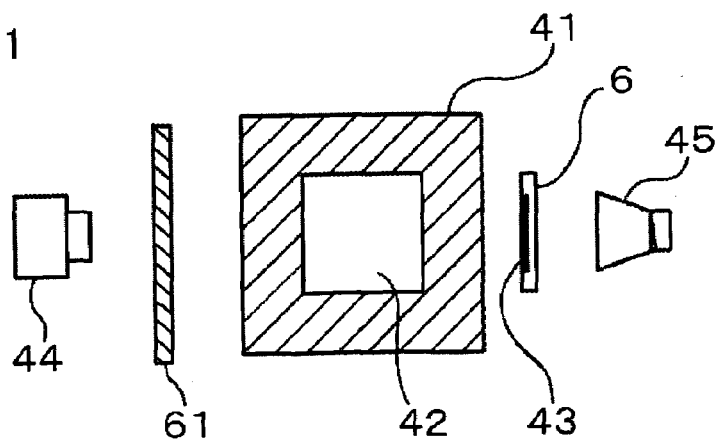

Furthermore in the present invention as described above CCD camera 44 and mark 43 sandwich transparent member 41. Alternatively, as shown for example in FIG. 10, transparent member 41 may have one side surface facing CCD camera 44 and transparent plate 6 bearing a mark and light 45, and the other side surface provided with a plate 61 serving as a screen. In that case, an image (or shadow) of mark 43 projected on screen plate 61 is picked up by CCD camera 44. Mark 43 may be arranged on transparent member 41. Such arrangement can also provide an effect similar to that as described above. Screen plate 61 may be replaced with a mirror. The projected image (or shadow) of mark 43 may be picked up in a different manner, by way of example, as follows: for example, as shown in FIG. 11, a semitransparent screen plate 61 or the like is arranged between CCD camera 44 and transparent member 41 and an image (or shadow) of mark 43 projected on screen plate 61 may be picked up. Such arrangement can also provide an effect similar to that as described above.

Furthermore, in the present invention, as described above, binarization is followed by taking a difference. Alternatively, taking a difference may precede binarization. Furthermore, the image process is not limited to binarization and may be a process such as exactly using an absolute value, a square or the like of a disjunction from a threshold value to consider a degree of disjunction. Furthermore in the present invention image data of R, G, B may be obtained to provide color image data, and in that case at least one of the R, G, and B data may be employed to make a decision.

Furthermore the present invention is also applicable to a substrate other than semiconductor wafer W, such as an LCD substrate, a reticle substrate for a photomask, and the like that are heated and thus processed. Furthermore, the processing liquid is not limited to photoresist or similar liquid to be applied, and the present invention is also be applicable for example to a liquid applied for insulation film, a development agent, and the like.

Figure 12:
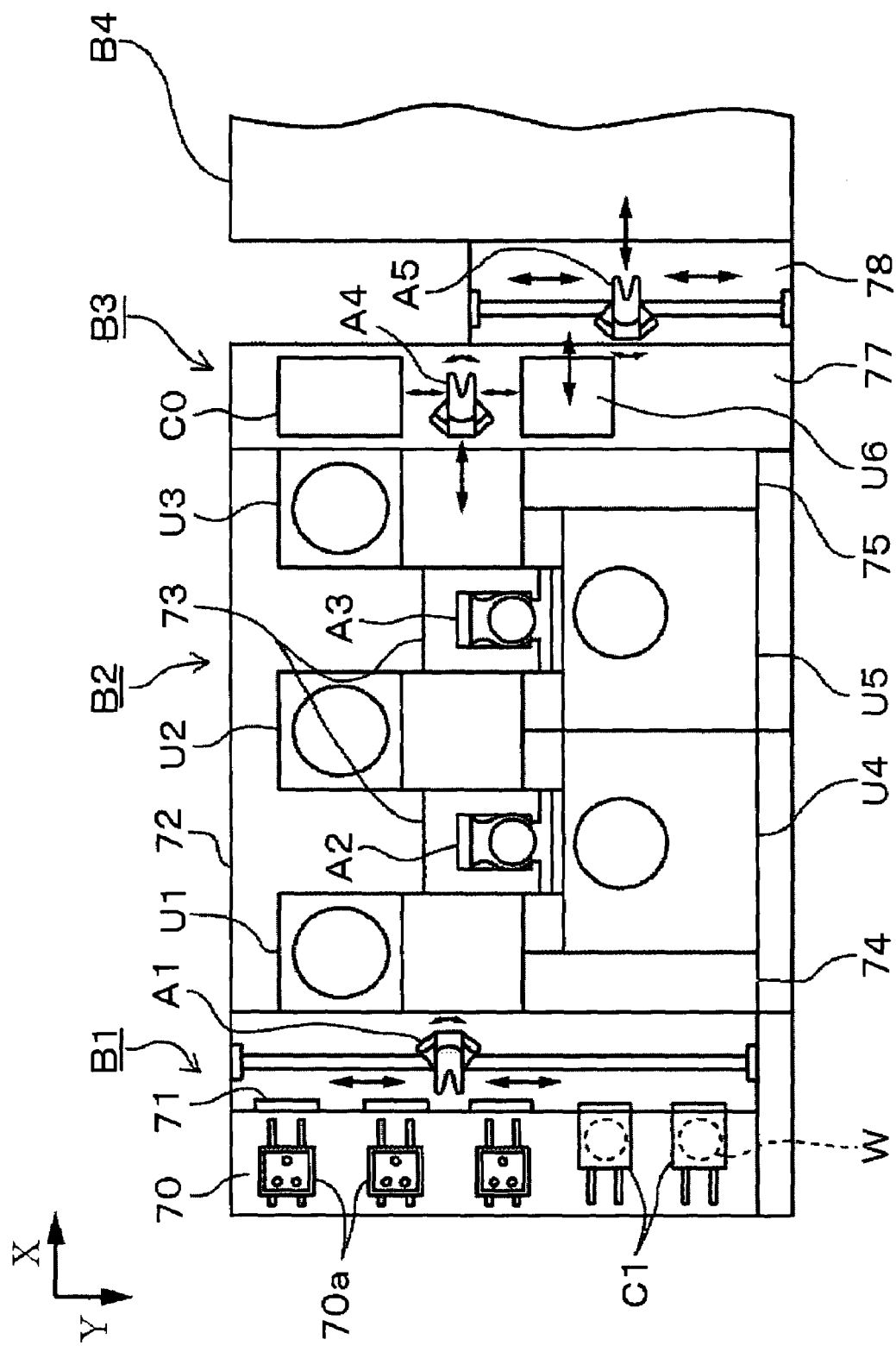
FIGS. 12 and 13 are plan and perspective views, respectively, of an application and development apparatus having the present liquid processing apparatus incorporated therein.

Finally, the present liquid processing apparatus is incorporated as an application unit into an application and development apparatus by way of example, as will now be simply described hereinafter with reference to FIGS. 12 and 13. In the figures, a carrier block B1 receives and outputs a carrier C1 housing and sealing e.g., 25 substrates or wafers Ws. Carrier block B1 includes a carrier station 70 having a portion 70*a* capable of bearing a plurality of carriers C1, an opening and closing portion 71 provided at a front sidewall as seen at carrier station 70, and a passing device A1 extracting wafer W from carrier C1 through opening and closing portion 71.

Behind carrier block B1 is connected a processing block B2 surrounded by a casing 72 and provided, as seen from a front side, with heating and cooling units in the form of multiple shelf units U1, U2 and U3, and main carrier devices A2 and A3 (corresponding to the carrying arm) serving as a substrate transport means passing wafer W between each processing unit including the application and development unit described later such that shelf units U1, U2, U3 and main carrier devices A2, A3 are arranged alternately. More specifically, shelf units U1, U2, U3 and main carrier devices A2, A3 are arranged in a line in the frontward and backward direction as seen at carrier block B1, with each connection provided with an opening (not shown) for carrying wafer W so that wafer W can be moved through processing block B2 from shelf unit U1 located one end to shelf unit U3 located at the other end, as desired. Main carrier device A2, A3 is placed in a space surrounded by a segment wall 73 defined by one surface adjacent to shelf unit U1, U2, U3 arranged in the frontward and backward direction as seen at carrier block B1, a surface adjacent to liquid processing unit U4, U5 arranged on the right hand, for example, and a rear surface forming a left surface. Furthermore there is also provided a temperature and humidity adjustment units 74, 75 including a device adjusting in temperature a liquid to be applied used in each unit, a duct associated with adjusting temperature and humidity, and the like.

Figure 13:
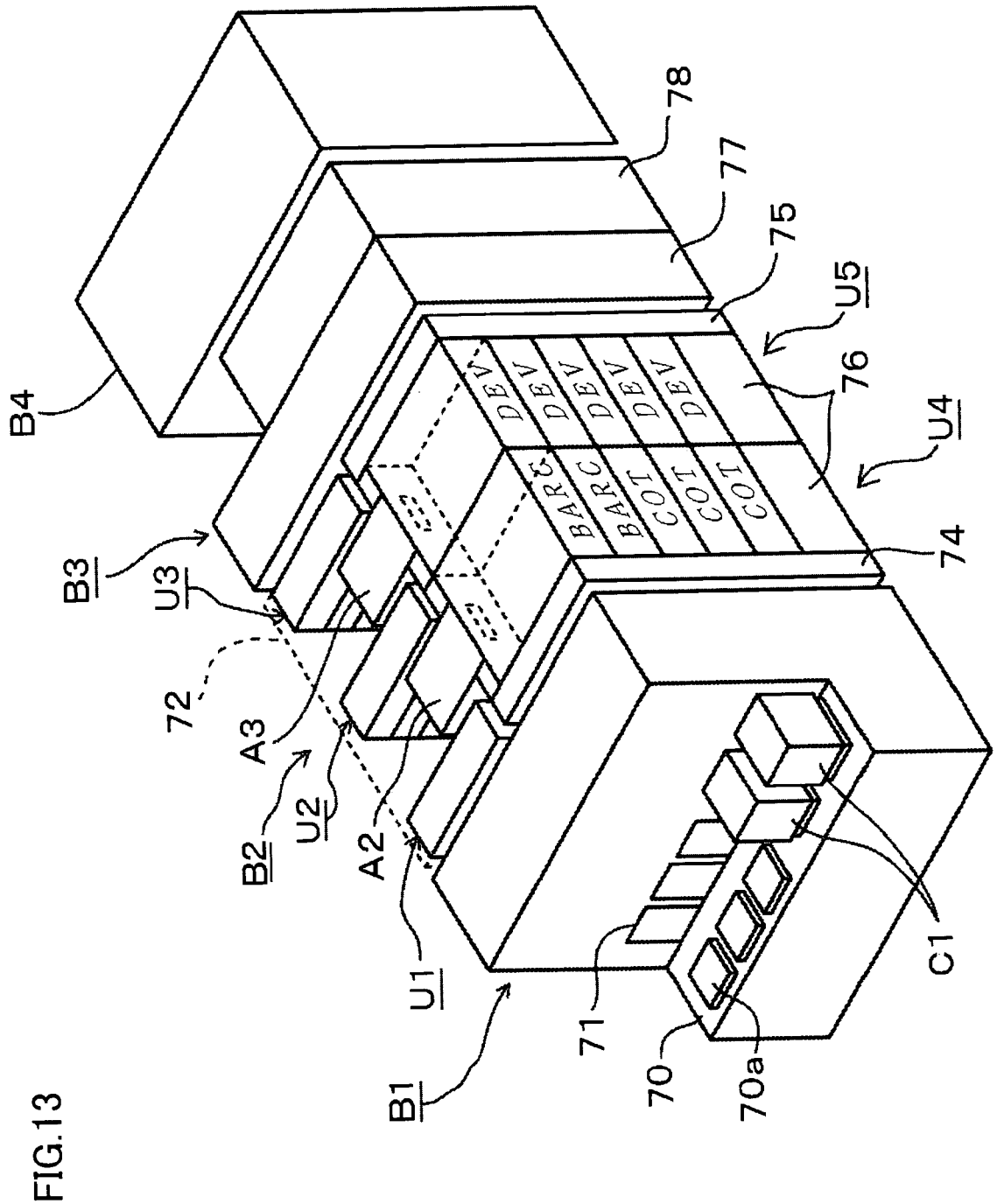
Figure 14:
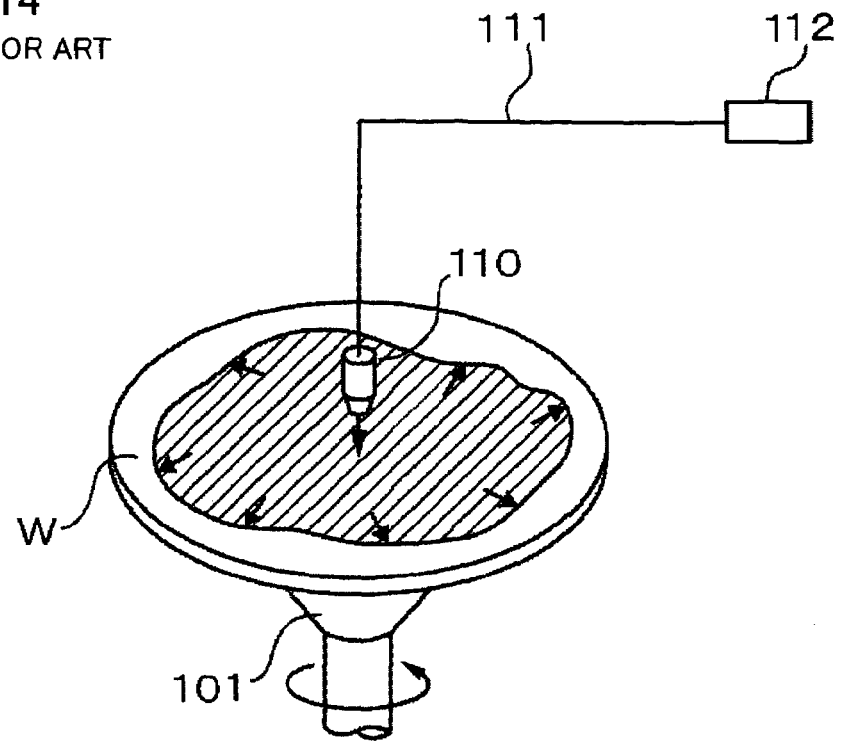
FIG. 14 illustrates a liquid spin-applied on a substrate's surface.
Figure 15:
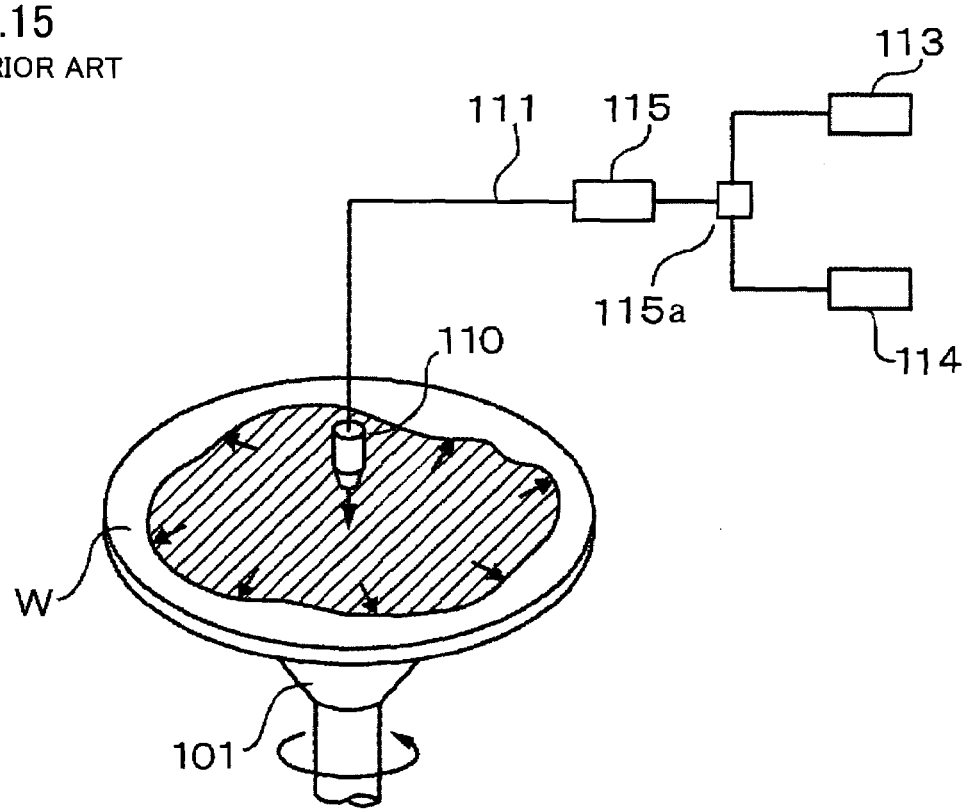
FIG. 15 illustrates one example of a conventional application apparatus.

Liquid processing units U4 and U5 are composed for example as shown in FIG. 13. More specifically, they includes a housing 76 providing a space for supplying a liquid to be applied, such as photoresist, a developing agent or similar regent, and an overlying application unit COT, an overlying development unit DEV, an overlying anti-reflection film production unit BARC and the like corresponding to the present liquid processing apparatus provided in the form of unit and stacked in multiple, for example five layers. Furthermore, shelf units U1, U2, U3 are configured of a variety of units in a plurality of (e.g., nine) layers and performing processes preceding and following those performed in liquid processing units U4 and U5, and their combination includes a post-exposure heating unit (PEB), a wafer W heating (or baking) unit, a wafer W cooling unit, and the like.

Behind the processing block B2 shelf unit U3 is connected for example through an interface block B3 including first and second carrying chambers 77 and 78 to an exposure block B4. Interface block B3 is internally provided with two passing devices A4 and A5 passing wafer W between processing block B2 and exposure block B4 as well as a shelf unit U6 and a buffer carrier C0.

In this apparatus wafer W is passed by way of example as follows: initially when carrier C1 having wafer W housed therein is externally placed on a platform 70*a*, together with opening and closing portion 71 carrier C1 has its lid removed and passing device A1 extracts wafer W. Wafer W is passed to main carrier device A2 via a passing unit (not shown) corresponding to a layer of shelf unit U1, and introduced into one of shelf units U1-U3 and subjected for example to an anti-reflection film production process and a cooling process as a process prior to an application process. Thereafter, wafer W is introduced into an application unit set to be capable of jetting out a liquid to be applied having a prescribed concentration, as has been described previously. Wafer thus has the liquid applied thereon and is then heated (or baked) in a heating (or baking) unit corresponding to one shelf of shelf units U1-U3, and then cooled, and thereafter carried via a passing unit of shelf unit U3 into interface block B3. Interface block B3 carries wafer W for example via passing device A4→shelf unit U6→passing device A5 to exposure block B4 for exposure. After the exposure, wafer W is carried on the reverse path to main carrier device A3 and developed by development unit DEV. A resist mask is thus formed. Thereafter, wafer W is returned to carrier C1 on platform 70*a*.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A liquid processing apparatus supplying a prescribed processing liquid on a surface of a substrate to perform a prescribed process, comprising:
   a substrate holder holding said substrate;
   a nozzle supplying said processing liquid on said surface of said substrate held by said substrate holder;
   a feed path passing said processing liquid to said nozzle; and
   fluctuation detection means detecting whether said processing liquid flowing through said feed path has fluctuation;
   wherein said fluctuation detection means includes:
   an optically transparent member having a flow path passing therethrough to pass said processing liquid;
   a mark provided on a side surface of said optically transparent member to be picked up;
   image acquisition means facing said mark with said flow path posed therebetween for obtaining image data of said mark with said processing liquid posed between said image acquisition means and said mark; and
   image processing means detecting from obtained image data of said mark whether said processing liquid has fluctuation.

2. The apparatus according to claim 1, wherein said image processing means detects whether said processing liquid has fluctuation from information obtained by comparing first image data of said mark and second image data of said mark obtained later than said first image data.

3. The apparatus according to claim 2, wherein said optically transparent member is a polygonal, cylindrical transparent member having said flow path passing therethrough.

4. The apparatus according to claim 1, wherein said optically transparent member is a polygonal, cylindrical transparent member having said flow path passing therethrough.

5. The apparatus according to claim 4, wherein said optically transparent member's one side surface provided with said mark and other side surface opposite said image acquisition means are provided at mutually parallel planar portions, respectively.

6. The apparatus according to claim 1, wherein said feed path is connected to a feed path feeding a concentration adjusting liquid adjusting said processing liquid in concentration, and said feed path feeding said processing liquid is provided with liquid mixture means for mixing said concentration adjusting liquid into a liquid to be applied.

7. The apparatus according to claim 1, further comprising a controller controlling the apparatus to supply said substrate with said processing liquid when said fluctuation detection means determines that said liquid does not have fluctuation.

8. A method supplying a prescribed processing liquid on a surface of a substrate held by a substrate holder to perform a prescribed process, comprising the steps of:

jetting out said processing liquid through a nozzle; and detecting whether said processing liquid flowing through a feed path feeding said processing liquid to said nozzle, has fluctuation, wherein in the step of detecting, said feed path passes said processing liquid, while image data of a mark behind said processing liquid is obtained and used to detect whether said processing liquid has fluctuation.

9. The method according to claim 8, wherein in the step of detecting, first image data of said mark and second image data of said mark obtained later than said first image data are compared to obtain information used to detect whether said processing liquid has fluctuation.

10. The method according to claim 8, wherein said processing liquid jetted out through said nozzle is a liquid having been mixed with a concentration adjusting liquid upstream of said feed path.

11. The method according to claim 8, further comprising the step of exerting control to supply said processing liquid to said substrate when a decision is made that said processing liquid does not have fluctuation.

12. A liquid condition detection apparatus comprising:

an optically transparent member having a flow path passing therethrough to pass said processing liquid;

a mark provided on a side surface of said optically transparent member to be picked up;

image acquisition means facing said mark with said flow path posed therebetween for obtaining image data of said mark with said processing liquid posed between said image acquisition means and said mark; and a fluctuation detector detecting from obtained image data of said mark whether said processing liquid has fluctuation.

13. The liquid condition detection apparatus according to claim 12, wherein said fluctuation detector detects whether said processing liquid has fluctuation from information obtained by comparing first image data of said mark and second image data of said mark obtained later than said first image data.

14. The liquid condition detection apparatus according to claim 13, wherein said optically transparent member is a polygonal, cylindrical transparent member.

15. The liquid condition detection apparatus according to claim 12, wherein said optically transparent member is a polygonal, cylindrical transparent member.

16. The liquid condition detection apparatus according to claim 15, wherein said optically transparent member's one side surface provided with said mark and other side surface opposite said image acquisition means are provided at mutually parallel planar portions, respectively.

* * * * *